United States Patent
Lu

(10) Patent No.: US 11,238,923 B2
(45) Date of Patent: Feb. 1, 2022

(54) MEMORY DEVICE

(71) Applicant: Taiwan Semiconductor Manufacturing Company, Ltd., Hsinchu (TW)

(72) Inventor: Shih-Lien Linus Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 66 days.

(21) Appl. No.: 16/657,323

(22) Filed: Oct. 18, 2019

(65) Prior Publication Data

US 2021/0118493 A1    Apr. 22, 2021

(51) Int. Cl.
*G11C 5/14* (2006.01)
*G11C 11/419* (2006.01)
*G11C 11/418* (2006.01)

(52) U.S. Cl.
CPC ............ *G11C 11/419* (2013.01); *G11C 5/148* (2013.01); *G11C 11/418* (2013.01)

(58) Field of Classification Search
CPC ...... G11C 11/418; G11C 11/419; G11C 5/148
See application file for complete search history.

(56) References Cited

U.S. PATENT DOCUMENTS

| | | | |
|---|---|---|---|
| 4,928,266 A | 5/1990 | Abbott et al. | |
| 2002/0161964 A1 | 10/2002 | Naffziger | |
| 2003/0231538 A1 | 12/2003 | Rimondi et al. | |
| 2009/0201712 A1 | 8/2009 | Akyildiz et al. | |
| 2014/0204687 A1* | 7/2014 | Sinangil | G11C 11/418 365/189.11 |
| 2015/0036418 A1 | 2/2015 | Chai et al. | |
| 2018/0358084 A1 | 12/2018 | Derner et al. | |
| 2019/0042160 A1* | 2/2019 | Kumar | G11C 11/419 |
| 2019/0304537 A1 | 10/2019 | Wong | |
| 2021/0005230 A1* | 1/2021 | Wang | G11C 7/1006 |

* cited by examiner

*Primary Examiner* — Toan K Le
(74) *Attorney, Agent, or Firm* — Merchant & Gould P.C.

(57) ABSTRACT

A memory device is provided. The memory device includes a cell array having a plurality of cells, each of the plurality of cells operative to store a bit value. The memory device further includes a reset circuit connected to the cell array. The reset circuit is operative to reset, in parallel, the bit value stored in each of the plurality of cells to a predetermined bit value.

20 Claims, 7 Drawing Sheets

MEMORY DEVICE

BACKGROUND

A common type of integrated circuit memory is a static random access memory (SRAM) device. A typical SRAM memory device has an array of memory cells. The memory cell uses six transistors connected between an upper reference potential and a lower reference potential (typically ground) such that one of two storage nodes can be occupied by the information to be stored, with the complementary information stored at the other storage node.

Power gating and voltage retention techniques are commonly implemented to the memory array to reduce power consumption. For example, power gates may be used to turn off memory periphery items in a deep sleep mode, and both the periphery items and the memory array in a shut down mode. Generally, an on-chip SRAM retains some of the bit values stored in the SRAM when it comes out of power down mode or shut down mode. This may be a security risk as the content may be readable by malicious programs. Moreover, some applications need to start a SRAM with all the bit values set to value zero. For example, an application may need to start with a clear SRAM and set individual bits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
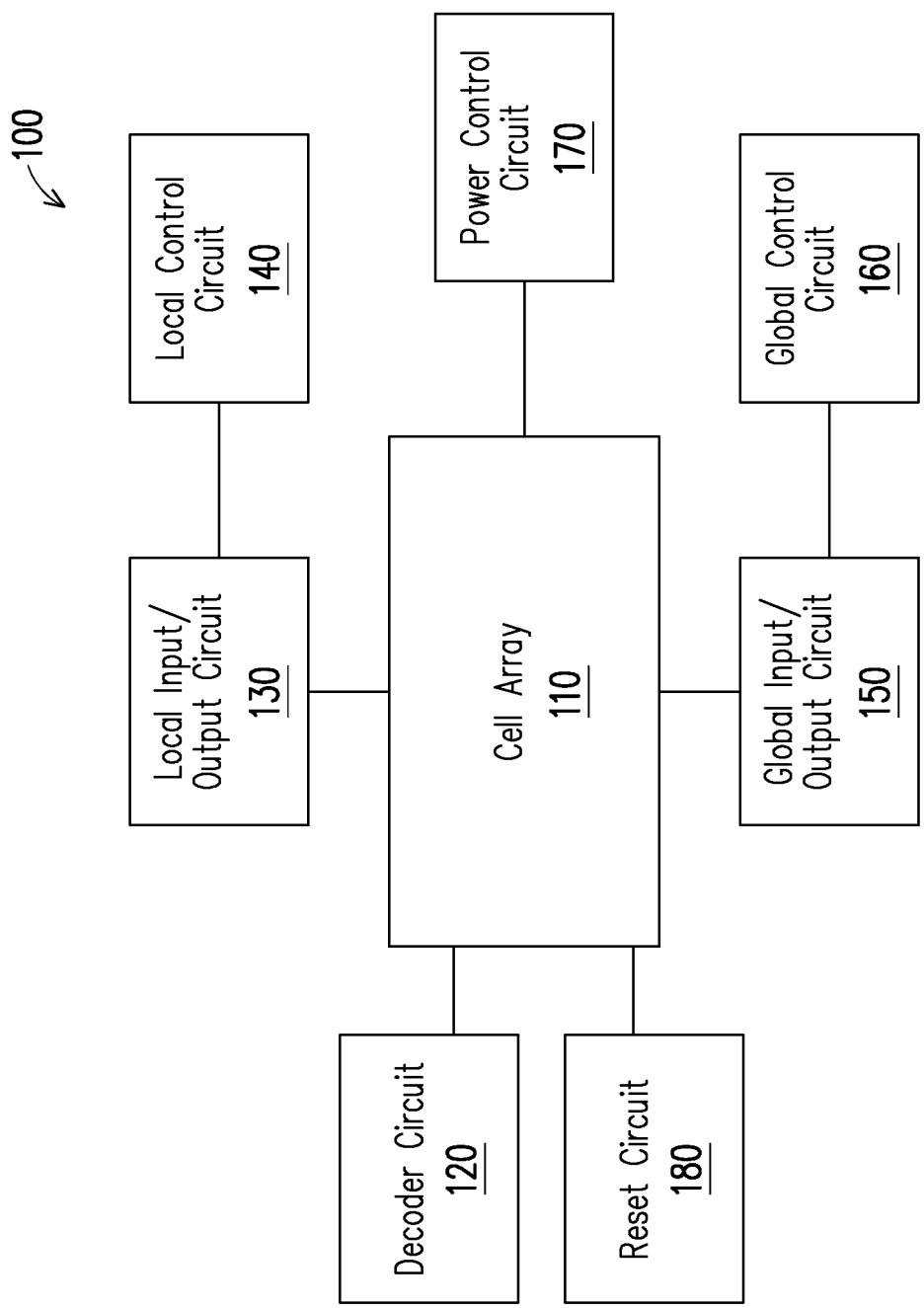
FIG. 1 is a block diagram illustrating an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 discloses a block diagram of an example memory device 100 in accordance with some embodiments. Memory device 100 can be a random access memory, such as a static random access memory (SRAM) device. As shown in FIG. 1, memory device 100 includes at least one cell array 110, as well as a plurality of peripheral circuits such as a decoder circuit 120, a local input/output (TO) circuit 130, a local control circuit 140, a global IO circuit 150, a global control circuit 160, a power control circuit 170, and a reset circuit 180. Memory device 100 may further include other components not shown in FIG. 1. In example embodiments, memory device 100 can be part of an integrated circuit (IC) chip.

Cell array 110 includes a plurality of memory cells (also referred to as plurality of bitcells) arranged in a matrix of m rows and n columns. Each of the plurality of cells of cell array 110 is operative to store one bit of information (that is, 0 or 1). The plurality of cells of cell array 110 are accessed through a plurality of word lines and a plurality of bit line pairs. Cell array 110 is discussed in greater detail with reference to FIG. 2. Although memory device 100 is shown to include only one cell array 110 for ease of discussion, memory device 100 could include multiple cell arrays 110.

The peripheral devices include circuits that provide various functions of memory device 100 associated with cell array 110. For instance, decoder circuit 120 of memory device 100 is operative to decode one or more address lines to select a word line (WL) of cell array 110 and charge the selected word line to a logic high. The logic high is approximately equal to a first predefined potential. In example embodiments, decoder circuit 120 includes a plurality of logic operators to decode potentials on the address lines to identify a word line to be activated. The address lines are charged to a logic high (that is, approximately equal to the first predetermined potential) or to a logic low (that is, approximately equal to a second predetermined potential). In example embodiments, the second predetermined potential is approximately equal to the ground potential or zero volts. In some embodiments, a number of output lines of decoder circuit 120 is equal to a number of rows of cell array 110, each of the outputs being associated with a word line of a row.

Local 10 circuit 130 of memory device 100 is operative to read and write data from and into cell array 110. For example, local IO circuit 130 is operative to sense potentials at the plurality of bit line pairs and compare the potentials for each pair. In example embodiments, when the potential of a first bit line is more than the potential of a second bit line of a bit line pair, local IO circuit 130 reads the output to be a bit value 1. In addition, when the potential of a first bit line is less than the potential of the second bit line of the bit line pair, local IO circuit 130 reads the output to be a bit value 0.

Local control circuit 140 of memory device 100 is operative to control local IO circuit 130. For example, local control circuit 140 is operative to configure local IO circuit 130 in a read mode to read information from cell array 110 or in a write mode to write information into cell array 110. In addition, local control circuit 140 is operative to enable local IO circuit 130 in a hold mode where no data is read from or written into cell array 110.

Global TO circuit 150 of memory device 100 is operative to combine input/output from local TO circuits 130. For example, memory device 100 may include multiple cell arrays 110 each having a respective local TO circuit 130. Global TO circuit 150 is operative to combine the information from multiple local TO circuits 130 into a global TO circuit 150 of memory device 100. For example, local TO circuits 130 are operable to store output from cell arrays 110 in a shift register, global TO circuit 150 is operable to read the data from the shift register, and provide the data as the output of memory device 100.

Global control circuit 160 of memory device 100 is operative to control global IO circuit 150. For example, global control circuit 160 is operative to configure global IO circuit 150 to select one or more local IO circuits 130 to read data from or write data into. In another example, global control circuit 160 is operative to configure a reading sequence for global IO circuit 150 to read data from, or a writing sequence to write data into one or more local IO circuits 130.

Power control circuit 170 is operative to control and manage power for one or more components of memory device 100. For example, power control circuit 170 is operative to selectively connect one or more components of memory device 100 to a voltage terminal in some embodiments. Power control circuit 170 includes a plurality of logic gates or power gates. Each of the plurality of power gates is operative to power up or power down an associated component of memory device 100. For example, power control circuit 170 is operative to generate a shut down (SD) signal to shut down all components of memory device 100. In addition, power control circuit 170 is operative to generate a deep sleep low power (DSLP) signal to shut down one or more peripheral circuit to reduce power consumption of memory device 100. Moreover, power control circuit 170 is operative to generate a ready (RDY) signal to indicate lowering up of memory device 100.

Reset circuit 180 is operative to reset the stored values in each of the plurality of cells of cell array 110 to a predetermined value. For example, reset circuit 180 is operative to reset the stored values in each of the plurality of cells of cell array 110 to a bit value 0 or to a bit value 1. Reset circuit 180 is discussed in greater detail with reference to FIG. 3 of the disclosure.

Figure 2:
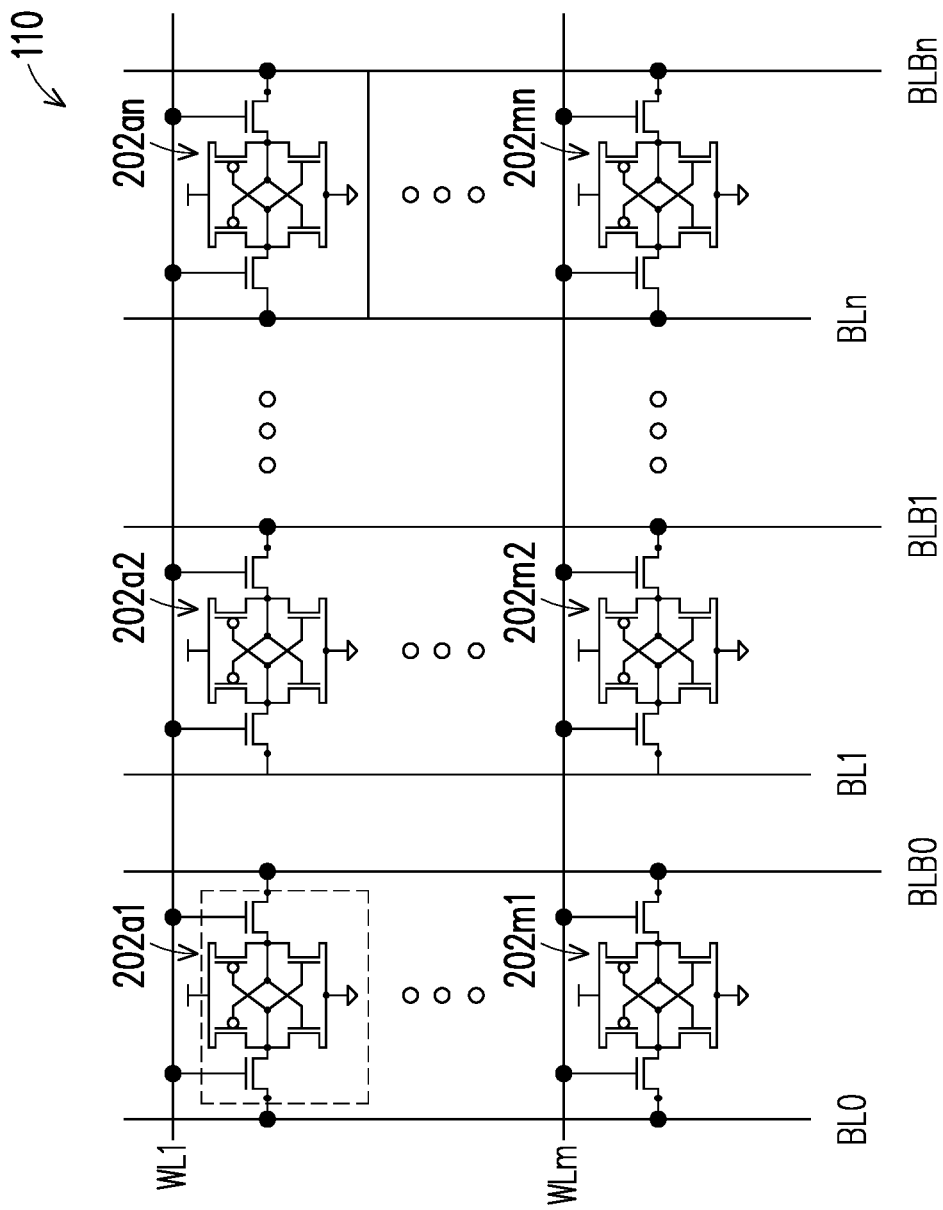
FIG. 2 is a diagram illustrating an example cell array in accordance with some embodiments.

FIG. 2 illustrates an example cell array 110 in accordance with some embodiments. As shown in in FIG. 2, cell array 110 includes a plurality of cells designated as 202$a$1, 202$a$2, ..., 202$mn$. Each cell of cell array 110 is operable to store one bit (that is, 0 or 1) of information. An example cell includes a pair of cross-coupled invertors (also referred to as Q and Q-bar—where Q-bar is complementary to Q) to store the one bit of information. The cross coupled invertors are connected to pair of access transistors which grant access to the information stored in the cross-coupled invertors. In example embodiments, cells of cell array 110 may be formed using four transistors, six transistors, or eight transistors. In addition, memory cells of cell array 110 can be single port cells or multi-port (such as, two port and three port) cells.

Continuing with FIG. 2, the plurality of memory cells of cell array 110 are arranged in a matrix of a plurality of rows (that is, m rows) and a plurality of columns (that is, n columns). Each of the m rows of cell array 110 include a first plurality of cells and each of the n columns of cell array 110 include a second plurality of cells. A number of rows and a number of columns of cell array 110 may depend on a size of cell array 110. For example, for a 32 kilo bit size, cell array 110 may include 256 rows and 128 columns.

For example, and as shown in FIG. 2, a first row of cell array 110 includes a first plurality of cells designated as 202$a$1, 202$a$2, ..., 202$an$. And each row may continue to the $m^{th}$ row of cell array 110 which includes the first plurality of cells designated as 202$m$1, 202$m$2, ..., and 202$mn$. Similarly, a first column of cell array 110 includes a second plurality of cells designated as 202$a$1, ..., 202$m$1. Moreover, a second column of cell array includes the second plurality of cells designated as 202$a$2, ..., 202$m$2. And each column may continue to the $n^{th}$ column which includes the second plurality of cells designated as 202$an$, ..., and 202$mn$.

Each of the first plurality of cells of the first row is connected to a first word line designated as WL1. Each row may continue to the $m^{th}$ row where each of the first plurality of cells is connected to a word line designated as WLm. Word lines WL1, WLm control access to the respective cells. For example, WL1 controls access to cells 202$a$1, 202$a$2, ..., and 202$an$. That is, to read or write data to cells 202$a$1, 202$a$2, ..., and 202$an$, WL1 is charged to logic 1. To hold data in cells 202$a$1, 202$a$2, ..., and 202$an$, WL1 is charged to logic 0.

Continuing with FIG. 2, the second plurality of cells in each column of cell array 110 are connected to a bit line pair. For example, the second plurality of cells of the first column designated as 2$a$1, ..., 2$m$1 are connected to a first bit line pair (that is, a first bit line BL0 and a second bit line BLB0). Similarly, the second plurality of cells of the second column designated as 2$a$2, ..., 2$m$2 are connected to a second bit line pair (that is, a first bit line BL1 and a second bit line BLB1). And each column may continue to the $n^{th}$ column wherein the second plurality of cells designated as 202$an$, ..., and 202$mn$ are connected to a nth bit line pair (that is, a first bit line BLn and a second bit line BLBn). In example embodiments, each of second bit lines BLB0, BLB1, ..., BLBn are complimentary to a corresponding one of first lines BL0, BL1, ..., BLBn of bit line pairs. The bit line pairs are used for reading or writing data to a cell.

The word lines WL1, ..., WLm are connected to gates of the pair of access transistors of associated cells. Therefore, when a word line is activated and charged to logic 1 (that is, charged to the first predetermined potential), the respective cells are connected to one bit line of the bit line pair. The associated cells are then accessed by comparing a potential difference between bit lines of the bit line pair In some embodiments, power gating and voltage retention techniques are implemented in the memory array to reduce power consumption. For example, power gates may be used to turn off memory periphery items in a deep sleep mode, and both the periphery items and the memory array in a shut down mode. An SRAM may retain some of the stored bit values when it comes out of power down mode or shut down mode. This may be a security risk as the content may be readable by malicious programs. Moreover, some applications need to start a SRAM with all the bit values set to value zero. For example, an application may need to start with a clear SRAM and set individual bits. SRAMs usually do not provide a means to reset the content to zero on shutdown.

One way to reset the content is to write zero at each corresponding address of the SRAM per cycle. Thus, to clear a SRAM with 1024 addresses may need 1024 cycles, for example. If there are multiple SRAM blocks, each block may need to be cleared. Hence, it may take too long (that is, too many cycles) to clear all SRAM blocks. In accordance with aspects of the present disclosure, a reset circuit is included to clear SRAM blocks efficiently and quickly.

Figure 3A:
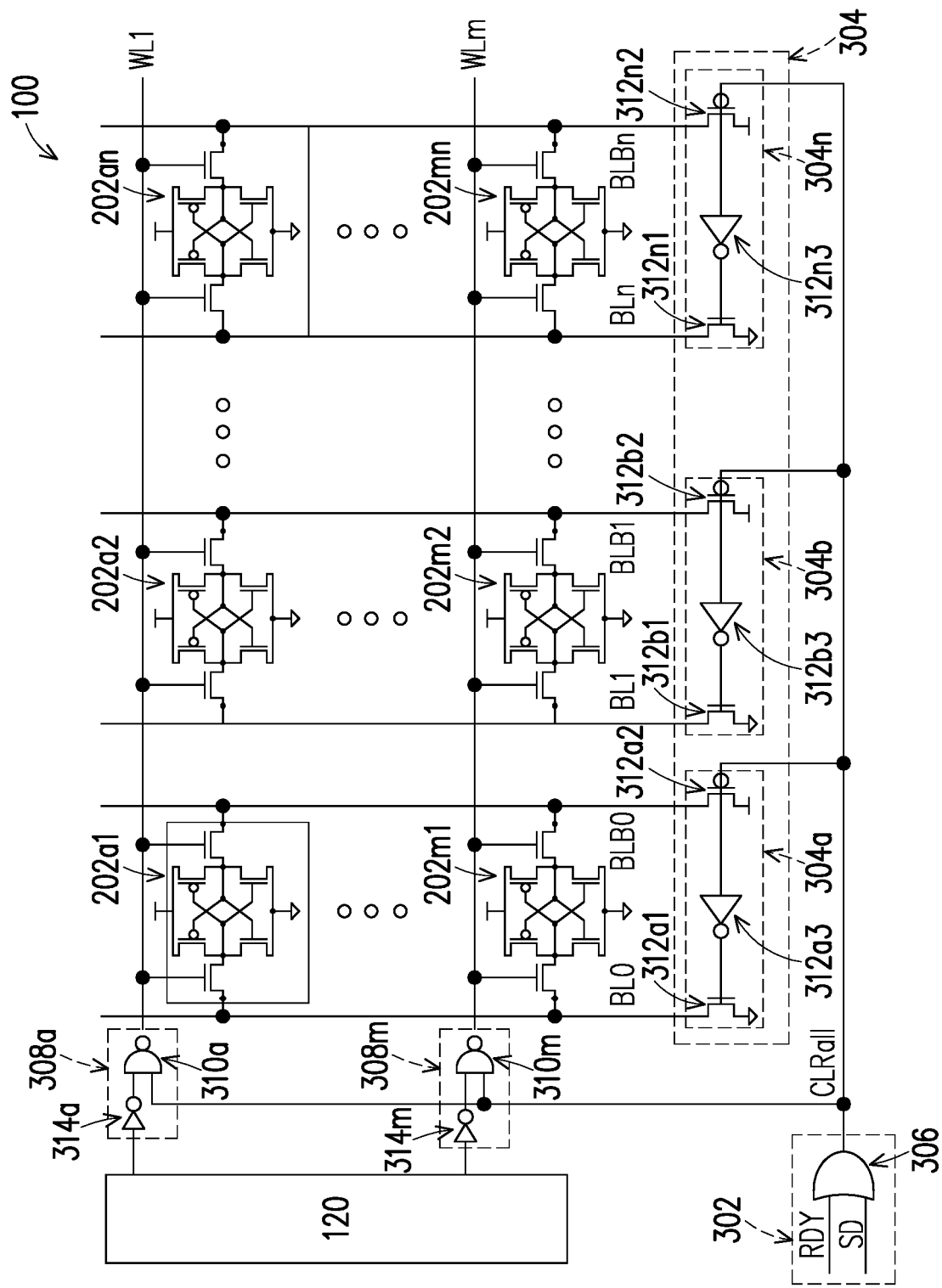
FIG. 3A is a diagram illustrating a memory device with a reset circuit in accordance with some embodiments.

FIG. 3A is a partial block diagram and a partial circuit diagram illustrating memory device 100 with a reset circuit, for example, reset circuit 180, in accordance with some embodiments. Reset circuit 180 can include, in some examples, a reset signal generator circuit 302, a plurality of bias circuits 304 (for example, a first bias circuit 304a, a second bias circuit 304b, . . . a nth bias circuit 304n), and a plurality of restoration circuit (that is, a first restoration circuit 308a, . . . , a mth restoration circuit 308m). Other configurations and components of reset circuit 180 are within the scope of the disclosure. For example, and as shown in FIG. 3A, memory device 100 includes reset signal generator circuit 302 and a plurality of bias circuits 304, that is, a first bias circuit 304a, a second bias circuit 304b, . . . , and a nth bias circuit 304n. Each of plurality of bias circuits 304 is associated with a column of memory device 100. For example, first bias circuit 304a is associated with the first column, second bias circuit 304b is associated with the second column, continuing to nth bias circuit 304n which is associated with the nth column.

In example embodiments, reset signal generator circuit 302 is operative to generate a reset signal, also referred to as a clear all (designated as CLRall) signal. As shown in FIG. 3A, reset signal generator circuit 302 implements logical disjunction of the SD signal and the RDY signal. For example, reset signal generator circuit 302 includes an OR logic gate 306. The SD signal is provided to a first input of OR logic gate 306 and the RDY signal is provided to a second input of OR logic gate 306. The CLRall signal is received at the output of OR logic gate 306. Hence, when both the SD signal and the RDY signal are at a logic low, the CLRall signal is also at a logic low. If one of the SD signal and the RDY signal is at a logic high, the CRLall signal is also at a logic high.

Each of plurality of bias circuits 304 is operative to set the bit line pairs of the associated column to a desired signal level. For example, plurality of bias circuits 304 is operative to set the first bit lines BL0, BL1, . . . , BLn of the associated bit line pair to a logic low and the second bit lines BLB0, BLB1, . . . , BLBn of the associated bit line pair to a logic high.

In example embodiments, each of plurality of bias circuits 304 may include a plurality of transistors and an invertor. For example, first bias circuit 304a includes a first transistor 312a1, a second transistor 312a2, and an invertor 312a3. Similarly, second bias circuit 304b includes a first transistor 312b1, a second transistor 312b2, and an invertor 312b3, continuing to nth bias circuit 304n which includes a first transistor 312n1, a second transistor 312n2, and an invertor 312n3. First transistors 312a1, 312b1, . . . , 312n1 of plurality of bias circuits 304 are also referred to as pull down transistors and may include NMOS transistors. However, other types of transistors are within scope of the disclosure. Second transistors 312a2, 312b2, . . . , 312n2 of plurality of bias circuits 304 are also referred to as pull up transistors and may include PMOS transistors. However, other types of transistors are within scope of the disclosure. Invertors 312a3, 312b3, . . . , 312n3 of plurality of bias circuits 304 may include NOT logic gates. However, other types of logic gates are within scope of the disclosure.

A source/drain of each of first transistors 312a1, 312b1, . . . , 312n1 of plurality of bias circuits 304 is connected to one of the first bit lines BL0, BL1, . . . , BLn of a corresponding column. In addition, a drain/source of each of first transistors 312a1, 312b1, . . . , 312n1 of plurality of bias circuits 304 is connected to a second potential (that is, the ground). A gate of each of first transistors 312a1, 312b1, . . . , 312n1 of plurality of bias circuits 304 is connected to an output of a corresponding one of invertors 312a3, 312b3, . . . , 312n3 of plurality of bias circuits 304.

A source/drain of each of second transistors 312a2, 312b2, . . . , 312n2 of plurality of bias circuits 304 is connected to one of the second bit lines BLB0, BLB1, . . . , BLBn of a corresponding column. In addition, a drain/source of each of second transistors 312a2, 312b2, . . . , 312n2 of plurality of bias circuits 304 is connected to a first potential (that is, the VCC). A gate of each of second transistors 312a2, 312b2, . . . , 312n2 of plurality of bias circuits 304 is connected to the output of reset signal generator circuit 302. Moreover, the output of reset signal generator circuit 302 is connected to gates of each of first transistors 312a1, 312b1, . . . , 312n1 and to an input of each of invertors 312a3, 312b3, . . . , 312n3.

Second transistors 312a2, 312b2, . . . , 312n2 are operative to charge the second bit line of each of the plurality of columns of cell array 110 to a logic high in response to the CLRall signal being at a logic low. Invertors 312a3, 312b3, . . . , 312n3 are operative to invert the CLRall signal and provide the inverted CRLall signal to a corresponding one of first transistors 312a1, 312b1, . . . , 312n1. The inverted CLRall signal causes the first bit line of each of the plurality of columns of cell array 110 to be charged to logic low when the CLRall signal is at logic low.

In addition, the output of reset signal generator circuit 302 is connected to each of word lines WL1, . . . , WLm of cell array 110 via a plurality of restoration circuits. For example, the output of reset signal generator circuit 302 is connected the first word line WL1 via a first restoration circuit 308a, continuing to the mth word line WLm which is connected to the output of reset signal generator circuit 302 is connected via mth restoration circuit 308m.

Each of plurality of restoration circuits 308a, . . . , 308m are operative to charge a corresponding one of the word lines WL1, . . . , WLm of cell array 110 to a logic high when triggered via the CLRall signal. Each of plurality of restoration circuits 308a, . . . , 308m includes a first logic gate and a second logic gate. For example, first restoration circuit 308a includes a first logic gate (that is, a NOT logic gate 314a) and a second logic gate (that is NAND logic gate 310a), continuing to the mth restoration circuit 308m which includes a first logic gate (that is, a NOT logic gate 314m) and a second logic gate (that is NAND logic gate 310m). An input of each of NOT logic gates 314a, . . . , 314m is connected to a corresponding output of decoder circuit 120. An output of each of NOT logic gates 314a, . . . , 314m is connected to a first input of a corresponding one of NAND logic gates 310a, . . . , 310m. The output of reset signal generator circuit 302 is connected to a second input of each of NAND logic gates 310a, . . . , 310m. An output of each of NAND logic gates 310a, . . . , 310m is connected to a corresponding one of word lines WL1, . . . , WLm.

The output of reset signal generator circuit 302 is connected to gates of each of second transistors 312a2, 312b2, . . . , 312n2 of plurality of bias circuit 304. In addition, the output of reset signal generator circuit 302 is connected to an input of each of invertors 312a3, 312b3, . . . , 312n3 of plurality of bias circuit 304. Each invertors 312a3, 312b3, . . . , 312n3 is operative to invert the CRLall signal. An output of each of invertors 312a3, 312b3, . . . , 312n3 is connected to a gate of a corresponding one of second transistors 312a2, 312b2, . . . , 312n2. In addition, an providing the inverted CLRall signal to second transistors 312a2, 312b2, . . . , 312n2 of plurality of bias circuit 304.

In operation, each of plurality of restoration circuits 308a, . . . , 308m is operative to charge a corresponding one of the word lines WL1, . . . , WLm to a logic high when both a decoder 120 signal and the CLRall signal is at a logic low at the corresponding one of the word lines WL1, . . . , WLm. For example, when output of decoder 120 is at a logic low and the CLRall signal is also at a logic low, the output of each of plurality of restoration circuits 308a, . . . , 308m is at a logic high, thereby charging each of word lines WL1, . . . , WLm to a logic high. Moreover, each of plurality of bias circuits 304 is operative to charge first bit lines BL0, BL1, . . . , BLn to a logic low and the second bit lines BLB0, BLB1, . . . , BLBn to a logic high when the CLRall signal is at a logic low. Hence, by charging each of the word lines WL1, . . . , WLm to a logic high, a bit value of zero is forced written in each of plurality of cells of cell array 110 in parallel by charging the first bit lines BL0, BL1, . . . , BLn to a logic low and the second bit lines BLB0, BLB1, . . . , BLBn to a logic high. That is, for the "reset" operation, a first node (that is, a Q node) of a cross-coupled invertor of each of the plurality of cells is set at a bit value of 0 and a complementary second node (that is, a $\overline{Q}$ node) of the cross-coupled invertor of each of the plurality of cells is set at a bit value of 1.

In example embodiments, cell array 110 of memory device 100 may be reset by writing a bit value of one in each of the plurality of cells. Such reset is also referred to as a set operation, as each of the plurality of cells is written over or "set" with a bit value of one. In example embodiments, a bit value of one in each of the plurality of cells may be written by charging the first bit lines BL0, BL1, . . . , BLn to a logic high and the second bit lines B1B0, BLB1, . . . , BLBn to a logic low. For example, for "set" operation, the first node (that is, the Q node) of the cross-coupled invertor of each of the plurality of cells is set at a bit value of 1 and the complementary second node (that is, the $\overline{Q}$ node) of the cross-coupled invertor of each of the plurality of cells is set at a bit value of 0.

Figure 3B:
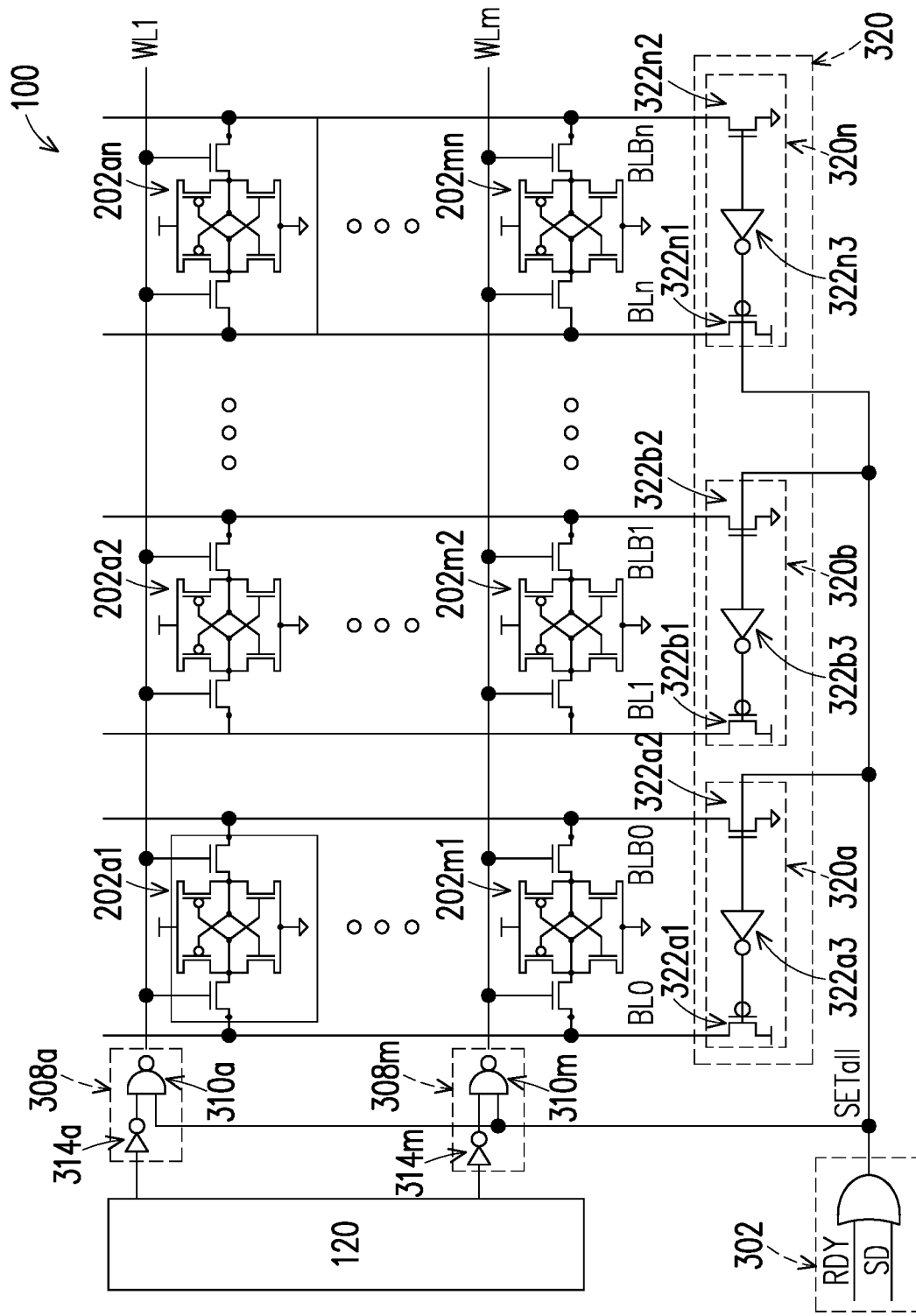
FIG. 3B is a diagram illustrating a memory device with another reset circuit in accordance with some embodiments.

FIG. 3B illustrates memory device 100 with another reset circuit which is operative to reset cell array 110 by writing a bit value of one in each of the plurality of cells. Reset circuit 180 of memory device 100 of FIG. 3B includes a reset signal generator circuit 302 and a plurality of bias circuits 320, that is, a first bias circuit 320a, a second bias circuit 320b, . . . , and a nth bias circuit 320n. Each of plurality of bias circuits 320 is associated with a column of memory device 100. For example, first bias circuit 320a is associated with the first column, second bias circuit 320b is associated with the second column, continuing to nth bias circuit 320n which is associated with the nth column. Plurality of bias circuits 320 are operative to set the first bit lines BL0, BL1, . . . , BLn of the associated bit line pair to a logic high and the second bit lines BLB0, BLB1, . . . , BLBn of the associated bit line pair to a logic low.

In example embodiments, each of plurality of bias circuits 320 may include a plurality of transistors and an invertor. For example, first bias circuit 320a includes a first transistor 322a1, a second transistor 322a2, and an invertor 322a3. Similarly, second bias circuit 320b includes a first transistor 322b1, a second transistor 322b2, and an invertor 322b3, continuing to nth bias circuit 320n which includes a first transistor 322n1, a second transistor 322n2, and an invertor 322n3. First transistors 322a1, 322b1, . . . , 322n1 of plurality of bias circuits 320 are also referred to as pull up transistors and may include PMOS transistors. However, other types of transistors are within scope of the disclosure. Second transistors 322a2, 322b2, . . . , 322n2 of plurality of bias circuits 320 are also referred to as pull down transistors and may include NMOS transistors. However, other types of transistors are within scope of the disclosure. Invertors 322a3, 322b3, . . . , 322n3 of plurality of bias circuits 320 may include NOT logic gates. However, other types of logic gates are within scope of the disclosure.

A source/drain of each of first transistors 322a1, 322b1, . . . , 322n1 of plurality of bias circuits 320 is connected to one of the first bit lines BL0, BL1, . . . , BLn of a corresponding column. In addition, a drain/source of each of first transistors 322a1, 322b1, . . . , 322n1 of plurality of bias circuits 320 is connected to a first potential (that is, the VDD). A gate of each of first transistors 322a1, 322b1, . . . , 322n1 of plurality of bias circuits 320 is connected to an input of a corresponding one of invertors 322a3, 322b3, . . . , 322n3 of plurality of bias circuits 320. In addition, a gate of each of first transistors 322a1, 322b1, . . . , 322n1 of plurality of bias circuits 320 is connected to the output of reset signal generator circuit 302. Moreover, the output of reset signal generator circuit 302 is connected to an input of each of invertors 322a3, 322b3, 322n3.

A source/drain of each of second transistors 322a2, 322b2, . . . , 322n2 of plurality of bias circuits 320 is connected to one of the second bit lines BLB0, BLB1, . . . , BLBn of a corresponding column. In addition, a drain/source of each of second transistors 322a2, 322b2, . . . , 322n2 of plurality of bias circuits 320 is connected to a second potential (that is, the ground). A gate of each of second transistors 322a2, 322b2, . . . , 322n2 is connected to an output of each of invertors 322a3, 322b3, . . . 322n3.

First transistors 322a1, 322b1, . . . , 322n1 are operative to charge the first bit line of each of the plurality of columns of cell array 110 to a logic high in response to a reset signal (which is also referred to as a SETall signal for the set operation) being at a logic low. Invertors 322a3, 322b3, . . . , 322n3 are operative to invert the SETall signal and provide the inverted SETall signal to a gate of a corresponding one of second transistors 322a2, 322b2, . . . , 322n2. The inverted SETall signal causes the second bit line of each of the plurality of columns of cell array 110 to be charged to logic high when the SETall signal is at logic low.

In operation, reset signal generator circuit 302 is operative to generate the SETall signal which is at a logic low when both the SD signal and the RDY signal are at a logic low. Each of plurality of restoration circuits 308a, . . . , 308m is operative to charge a corresponding one of the word lines WL1, . . . , WLm to a logic high when both decoder 120 signal and the SETall signal is at a logic low for the one of the word lines WL1, . . . , WLm. Moreover, each of plurality of bias circuits 320 is operative to charge first bit lines BL0, BL1, . . . , BLn to a logic high and the second bit lines BLB0, BLB1, . . . , BLBn to a logic low when the SETall signal is at a logic low. By charging each of the word lines WL1, . . . , WLm to a logic high, a bit value of one is forced written in each of plurality of cells of cell array 110 in parallel by charging the first bit lines BL0, BL1, . . . , BLn to a logic high and the second bit lines BLB0, BLB1, . . . , BLBn to a logic low. That is, for the "set" operation, the first node (that is, the Q node) of the cross-coupled invertor of each of the plurality of cells is set at a bit value of 1 and the complementary second node (that is, the $\overline{Q}$ node) of the cross-coupled invertor of each of the plurality of cells is set at a bit value of 0.

In FIG. 3B, each memory cell of the cell array 110 may be written or "reset" with a logical low value by reset by writing a bit value of zero in each of the plurality of cells. In example embodiments, a bit value of zero in each of the plurality of cells may be written by charging the first bit lines BL0, BL1, . . . , BLn to a logic low and the second bit lines B1B0, BLB1, . . . , BLBn to a logic high. That is, for the "reset" operation, the first node (that is, the Q node) of the cross-coupled invertor of each of the plurality of cells is set at a bit value of 0 and the complementary second node (that is, the $\overline{Q}$ node) of the cross-coupled invertor of each of the plurality of cells is set at a bit value of 1.

In example embodiments, when a number of the plurality of cells in cell array 110 is more than a predetermining number, the plurality of cells are segmented into sub-blocks for re-setting. For example, when the number of the plurality of cells in cell array 110 is more than 64 k then, the plurality of cells are segmented into more than one sub-blocks, each of the sub-blocks having less than or equal to 64 k cells. In addition, when a number of columns is more than a predetermined number, then the plurality of cells are partitioned into multiple sub-blocks each containing less than or equal to the predetermined number of columns. Similarly, when a number of rows is more than a predetermined number, then the plurality of cells are partitioned into multiple sub-blocks each containing less than or equal the predetermined number of rows.

Figure 3C:
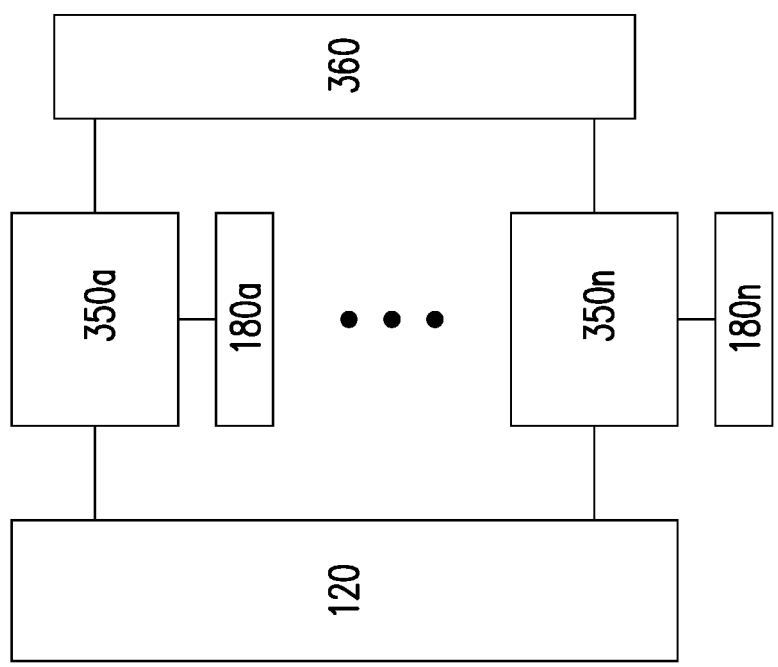
FIG. 3C is a diagram illustrating a memory device with multiple sub-blocks in accordance with some embodiments.

FIG. 3C illustrates an example memory device with multiple sub-blocks in accordance with some embodiments. As shown in FIG. 3C, memory device 100 includes a plurality of sub-blocks (350*a*, . . . , 350*n*). Each of the plurality of sub-blocks may include up to a predetermined number of cells, columns, or rows. The plurality of cells in the sub-blocks are reset using a corresponding (that is, a dedicated) reset circuit (designated as 180*a*, . . . , 180*n*). For example, the plurality of cells of a first sub-block 350*a* is reset using a first reset circuit 180*a* continuing to a plurality of cells of a nth sub-block 350*n* which is reset using a nth reset circuit 180*n*. In example embodiments, a finite state machine 360 is provided to the co-ordinate re-setting of plurality of sub-blocks 350*a*, . . . , 350*n*. For example, finite state machine 360 may determine that a plurality of cells of first sub-block 350*a* have been reset and triggers resetting of a next sub-block continuing to nth sub-block 350*n*. In other examples, finite state machine 360 is implemented as a counter which is incremented by a value 1 after resetting of a sub-block tallying up to a total number of sub-blocks of cell array 110 of memory device 100.

Figure 4:
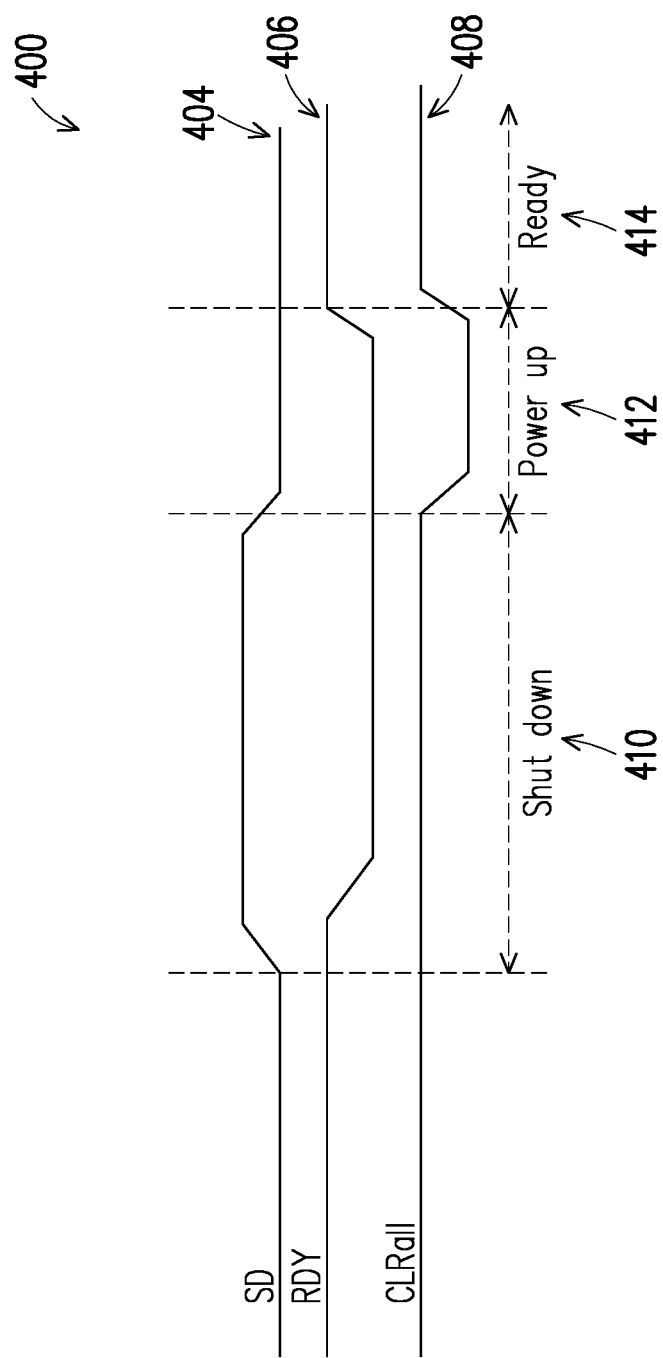
FIG. 4 illustrates timing diagrams of a reset circuit in accordance with some embodiments.

FIG. 4 illustrates a timing diagram 400 for memory device 100 in accordance with some embodiments. For example, FIG. 4 illustrates timing diagrams of the SD signal (designated as 404), the RDY signal (designated as 406), and the CLRall signal (designated as 408). As shown in the timing diagram 400, during a shut down duration (designated as 410) the SD signal is at a logic high. There is no power supply to memory device 100 during the shut down duration. In addition, during the shut down duration, the RDY signal is at a logic low indicating that memory device 100 is not ready for access.

The ending of shut down duration begins with the DSLP signal changing from a logic high to a logic low. The DSLP signal changing from a logic low to a logic low triggers powering up of the peripheral components of memory device 100. For example, the DSLP signal changing to a logic low triggers powering up of decoder circuit 120, local input/output (TO) circuit 130, local control circuit 140, global IO circuit 150, global control circuit 160, power control circuit 170, and reset circuit 180.

After a first predetermined duration from when the DSLP signal changes to a logic low, the SD signal also changes from a logic high to a logic low. The changing of the SD signal from a logic high to a logic low also marks beginning of a power up duration (designated as 412). The first predetermined duration between changing of the DSLP signal and the SD signal is determined as a time sufficient to power up the peripheral component of memory device 100. The changing of SD signal to a logic low triggers powering up of cell array 110 of memory device 100.

In addition, and as shown in FIG. 4, at the end of the power up process (or the end of shut down process), the SD signal changes to a logic low which results in the CLRall signal to change from a logic high to a logic low. The CLRall signal changing to a logic low triggers resetting of the plurality of cells of cell array 110 with a predetermined bit value. The CLRall signal remains at a logic low for the power up duration. The power up duration is determined as a time sufficient to reset each of the plurality of cells of cell array 110 to a predetermined bit value. At the end of the power up duration, the RDY signal changes from a logic low to a logic high indicating that memory device 100 is ready for access. The changing of the RDY signal causes the CLRall signal to change to a logic high thereby turning off first transistors 412*a*1, 412*b*1, . . . , 412*n*1 and second transistors 412*a*2, 412*b*2, . . . , 412*n*2.

Figure 5:
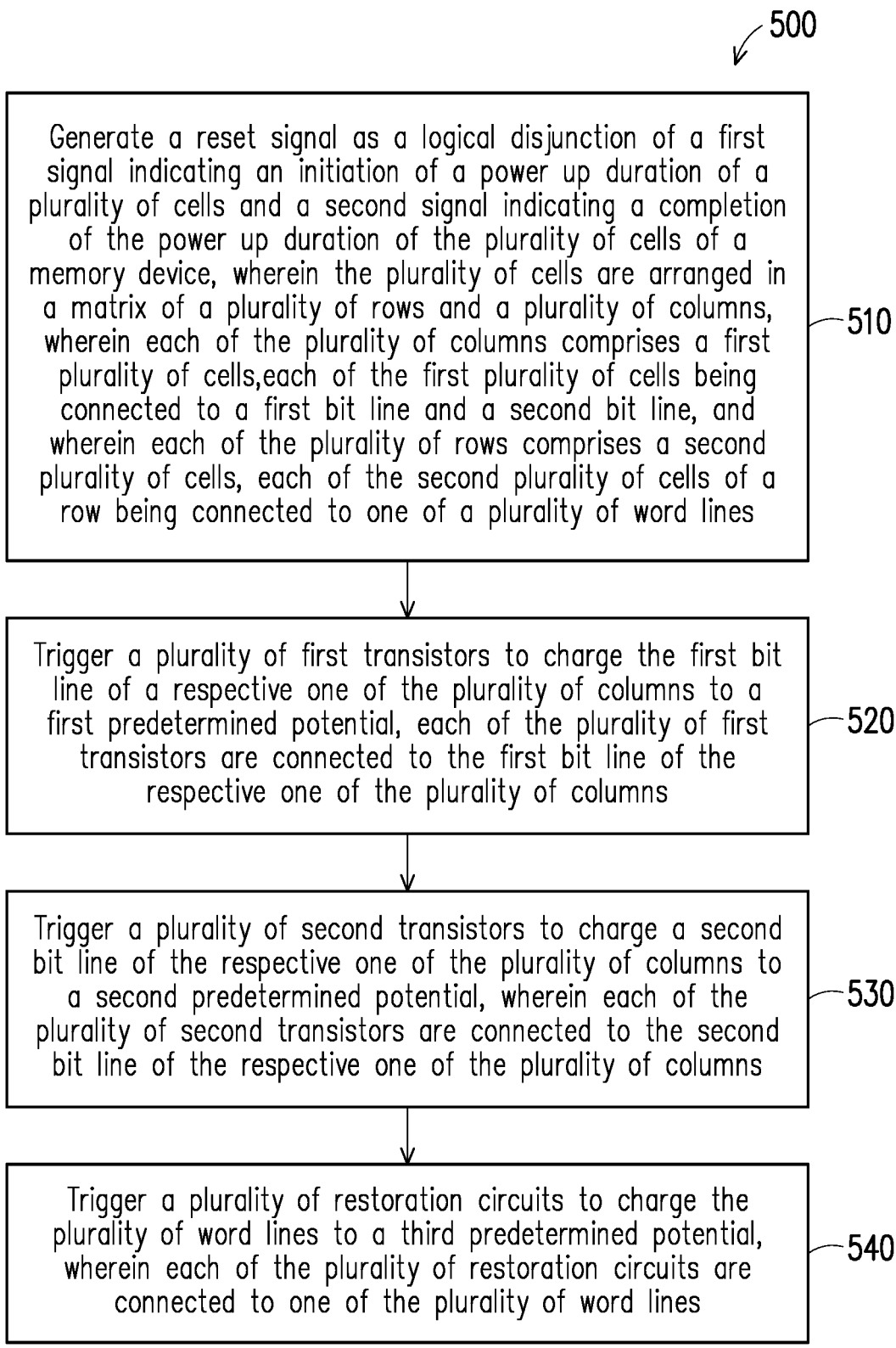
FIG. 5 is a flow diagram illustrating a method for resetting a memory device in accordance with some embodiments.

FIG. 5 is a flow diagram of a method 500 for resetting a memory device in accordance with some embodiments. Steps of method 500 may be stored as instructions which may be executed by a processor to implement method 500. At block 510 of method 500, a reset signal as a logical disjunction of a first signal (that is, the SD signal) indicating an initiation of a power up duration of a plurality of cells and a second signal (that is, the RDY signal) indicating a completion of the power up duration of the plurality of cells of memory device 100 is generated. The plurality of cells of memory device 100 are arranged in a matrix of a plurality of rows and a plurality of columns, wherein each of the plurality of columns comprises a first plurality of cells, each of the first plurality of cells being connected to a first bit line and a second bit line, and wherein each of the plurality of rows comprises a second plurality of cells, each of the second plurality of cells of a row being connected to one of a plurality of word lines.

At block 520 of method 500, a plurality of first transistors (designated as 312*a*1, 312*b*1, . . . , 312*n*1) are triggered to charge the first bit line of a respective one of the plurality of columns to a first predetermined potential, each of the plurality of first transistors (designated as 312*a*1, 312*b*1, . . . , 312*n*1) are connected to the first bit line of the respective one of the plurality of columns. At block 530 of method 500, a plurality of second transistors (designated as 312*a*2, 312*b*2, . . . , 312*n*2) are triggered to charge a second bit line of the respective one of the plurality of columns to a second predetermined potential, wherein each of the plurality of second transistors (designated as 312*a*2, 312*b*2, . . . , 312*n*2) are connected to the second bit line of the respective one of the plurality of columns. At block 540 of method 500, a plurality of restoration circuits (designated as 308$a$, . . . , 308$m$) are triggered to charge the plurality of word lines (designated as WL1, . . . , WLm) to a third predetermined potential, wherein each of the plurality of restoration circuits (designated as 308$a$, . . . , 308$m$) are connected to one of the plurality of word lines (designated as WL1, . . . , WLm).

In accordance with example embodiments, a memory device comprises: a cell array comprising a plurality of cells, each of the plurality of cells operative to store a bit value; and a reset circuit connected to the cell array, wherein the reset circuit is operative to reset, in parallel, the bit value stored in each of the plurality of cells to a predetermined bit value.

In example embodiments, a memory device comprises: a cell array comprising a plurality of cells, each of the plurality of cells operative to store one bit value; a power control circuit operative to generate a first signal indicating an initiation of a power up duration of the plurality of cells and a second signal indicating a completion of the power up duration of the plurality of cells; and a reset circuit operative to reset, in parallel, the bit value stored in each of the plurality of cells to a predetermined bit value during the power up duration.

In accordance with example embodiments, a method of resetting a memory device comprises: generating a reset signal as a logical disjunction of a first signal indicating an initiation of a power up duration of a plurality of cells and a second signal indicating a completion of the power up duration of the plurality of cells of a memory device; and triggering, through the reset signal, a reset of a bit value stored in each of a plurality of cells of a cell array of a memory device to a predetermined bit value in parallel during the power up duration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a cell array comprising a plurality of cells, each of the plurality of cells operative to store a bit value; and
   a reset circuit connected to the cell array, wherein the reset circuit is operative to reset, in parallel, the bit value stored in each of the plurality of cells to a predetermined bit value, wherein the reset circuit comprises a reset signal generator circuit operative to generate a reset signal, and wherein the reset signal is operative to trigger resetting, in parallel, of the bit value stored in each of the plurality of cells to the predetermined bit value.

2. The memory device of claim 1, wherein the plurality of cells are arranged in a matrix of a plurality of rows and a plurality of columns, wherein each of the plurality of columns comprises a first plurality of cells, each of the first plurality of cells being connected to a first bit line and a second bit line, and wherein each of the plurality of rows comprises a second plurality of cells, each of the second plurality of cells of a row being connected to a word line.

3. The memory device of claim 2, wherein the reset circuit is operative to reset each of the plurality of cells to the predetermined value comprises the reset circuit being operative to charge the first bit line of each of the plurality of columns to a first predetermined potential, the second bit line of each of the plurality of columns to a second predetermined potential, and the word line of each of the plurality of rows to a third predetermined potential.

4. The memory device of claim 1, wherein the reset circuit further comprises a plurality of bias circuits and a plurality of restoration circuits, wherein the reset signal being operative to trigger the resetting, in parallel, of the bit value stored in each of the plurality of cells to the predetermined bit value comprises the reset signal being operative to:
   trigger each of the plurality of bias circuits to charge the first bit line of a respective one of the plurality of columns to the first predetermined potential and the second bit line of the respective one of the plurality of columns to the second predetermined potential, and
   trigger the plurality of restoration circuits to charge the word line of each of the plurality of rows to a third predetermined potential.

5. The memory device of claim 4, wherein each of the plurality of bias circuits comprises a first transistor operative to charge the first bit line of the corresponding one of the plurality of columns to the first predetermined potential and a second transistor operative to charge the second bit line of the corresponding one of the plurality of columns to the second predetermined potential.

6. The memory device of claim 4, wherein each of the plurality of restoration circuits comprises an invertor and a NAND logic gate, wherein an input of the NAND gate is connected to a respective output of a decoder circuit and an output of the invertor is connected to a first input of the NAND gate, and wherein the reset signal is provided to a second input, and wherein an output of the NAND gate is connected to the word line.

7. The memory device of claim 1, wherein the reset signal generator circuit being operative to generate the reset signal comprises the reset signal generator circuit being operative to determine a logical disjunction of a first signal and a second signal, the first signal indicating an initiation of a power up duration of the plurality of cells and a second signal indicating a completion of the power up duration of the plurality of cells.

8. The memory device of claim 7, wherein the reset signal generator circuit comprises an OR logic gate.

9. A memory device comprising:
   a cell array comprising a plurality of cells, each of the plurality of cells operative to store one bit value;
   a power control circuit operative to generate a first signal indicating an initiation of a power up duration of the plurality of cells and a second signal indicating a completion of the power up duration of the plurality of cells; and
   a reset circuit operative to reset, in parallel, the bit value stored in each of the plurality of cells to a predetermined bit value during the power up duration.

10. The memory device of claim 9, wherein the reset circuit is operative generate a third signal, the third signal being operative to trigger the reset of the bit value stored in each of the plurality of cells to the predetermined bit value during the power up duration.

11. The memory device of claim 9, wherein the reset circuit is operative generate the third signal comprises the reset circuit is operative to generate the third signal as a logical disjunction of the first signal and the second signal.

12. The memory device of claim 9, wherein the reset circuit being operative to reset the bit value stored in each of the plurality of cells to the predetermined bit value during the power up duration comprises the reset circuit being operative to:
   determine that a number of the plurality of cells is more than a predetermined number; and
   partition the plurality of cells in a first sub-block and a second sub-block.

13. The memory device of claim 12, wherein the reset circuit being operative to:
   reset a first plurality of cells in the first sub-block in parallel; and
   reset a second plurality of cells in the second sub-block in parallel.

14. The memory device of claim 12, wherein the reset circuit further comprises a finite state machine operative to indicate a status of reset of the first plurality of cells in the first sub-block and reset of the second plurality of cells in the second sub-block.

15. The memory device of claim 9, wherein the reset circuit being operative to reset the bit value stored in each of the plurality of cells to the predetermined bit value during the power up duration comprises the reset circuit operative to reset the bit value stored in each of the plurality of cells to a bit value zero during the power up duration.

16. The memory device of claim 9, wherein the power control circuit is operative to generate a fourth signal prior to the first signal, wherein the fourth signal is operative to power up a plurality of peripheral components of the memory device.

17. A method of resetting a memory device, the method comprising:
   generating a reset signal as a logical disjunction of a first signal indicating an initiation of a power up duration of a plurality of cells and a second signal indicating a completion of the power up duration of the plurality of cells of a memory device; and
   triggering, through the reset signal, a reset of a bit value stored in each of a plurality of cells of a cell array of a memory device to a predetermined bit value in parallel during the power up duration.

18. The method of claim 17, wherein triggering, through the reset signal, the reset of the bit value stored in each of the plurality of cells of the cell array of the memory device to the predetermined bit value in parallel during the power up duration comprises triggering, through the reset signal, the reset of a bit value stored in each of the plurality of cells of a cell array of the memory device to the predetermined bit value in parallel during the power up duration, wherein the plurality of cells are arranged in a matrix of a plurality of rows and a plurality of columns, wherein each of the plurality of columns comprises a first plurality of cells, each of the first plurality of cells being connected to a first bit line and a second bit line, and wherein each of the plurality of rows comprises a second plurality of cells, each of the second plurality of cells of a row being connected to one of a plurality of word lines.

19. The method of claim 18, wherein triggering, through the reset signal, the reset of the bit value stored in each of the plurality of cells of the cell array of the memory device to the predetermined bit value in parallel during the power up duration comprises:
   triggering a plurality of first transistors to charge the first bit line of a respective one of the plurality of columns to a first predetermined potential, each of the plurality of first transistors are connected to the first bit line of the respective one of the plurality of columns;
   triggering a plurality of second transistors to charge a second bit line of the respective one of the plurality of columns to a second predetermined potential, wherein each of the plurality of second transistors are connected to the second bit line of the respective one of the plurality of columns; and
   triggering a plurality of restoration circuits to charge the plurality of word lines to a third predetermined potential, wherein each of the plurality of restoration circuits are connected to one of the plurality of word lines.

20. The method of claim 17, wherein triggering, through the reset signal, the reset of the bit value stored in each of the plurality of cells of the cell array of the memory device to the predetermined bit value in parallel during the power up duration comprises:
   determining that a number of the plurality of cells is more than a predetermined number;
   partitioning the plurality of cells in a first sub-block and a second sub-block
   triggering reset of a first plurality of cells in the first sub-block in parallel; and
   triggering reset of a second plurality of cells in the second sub-block in parallel.

* * * * *

UNITED STATES PATENT AND TRADEMARK OFFICE
CERTIFICATE OF CORRECTION

| | | |
|---|---|---|
| PATENT NO. | : 11,238,923 B2 | |
| APPLICATION NO. | : 16/657323 | |
| DATED | : February 1, 2022 | |
| INVENTOR(S) | : Shih-Lien Linus Lu | |

It is certified that error appears in the above-identified patent and that said Letters Patent is hereby corrected as shown below:

In the Specification

Column 6, Lines 39-40:
"connected the" should read --connected to the--

Column 12, Line 62:
"operative generate" should read --operative to generate--

Column 12, Line 67:
"operative generate" should read --operative to generate--

Signed and Sealed this
First Day of November, 2022

Katherine Kelly Vidal
*Director of the United States Patent and Trademark Office*